US012650445B2

(12) United States Patent
Amelio

(10) Patent No.: US 12,650,445 B2
(45) Date of Patent: Jun. 9, 2026

(54) PROBE HEAD FOR WAFER-LEVEL BURN-IN TEST (WLBI) AND PROBE CARD COMPRISING SAID PROBE HEAD

(71) Applicant: Microtest S.p.A., Vicopisano (IT)

(72) Inventor: Giuseppe Amelio, San Pietro (IT)

(73) Assignee: MICROTEST S.P.A., Vicopisano (IT)

( * ) Notice: Subject to any disclaimer, the term of this patent is extended or adjusted under 35 U.S.C. 154(b) by 163 days.

(21) Appl. No.: 18/530,420

(22) Filed: Dec. 6, 2023

(65) Prior Publication Data

US 2024/0183882 A1     Jun. 6, 2024

(30) Foreign Application Priority Data

Dec. 6, 2022    (EP) ..................................... 22211705

(51) Int. Cl.
| | |
|---|---|
| *G01R 1/073* | (2006.01) |
| *G01R 1/02* | (2006.01) |
| *G01R 1/04* | (2006.01) |
| *G01R 1/067* | (2006.01) |
| *G01R 3/00* | (2006.01) |
| *G01R 31/02* | (2006.01) |
| *G01R 31/26* | (2020.01) |
| *G01R 31/28* | (2006.01) |

(52) U.S. Cl.
CPC ..... *G01R 1/07371* (2013.01); *G01R 31/2886* (2013.01)

(58) Field of Classification Search
CPC . G01R 1/02; G01R 1/04; G01R 1/067; G01R 1/073; G01R 1/20; G01R 31/02; G01R 31/26; G01R 31/28; G01R 3/00
See application file for complete search history.

(56) References Cited

U.S. PATENT DOCUMENTS

| | | |
|---|---|---|
| 6,504,223 B1 | 1/2003 | Zhou et al. |
| 6,576,485 B2 | 6/2003 | Zhou et al. |
| 2003/0193342 A1 | 10/2003 | Longson et al. |

(Continued)

FOREIGN PATENT DOCUMENTS

WO          03048788 A1     6/2003

OTHER PUBLICATIONS

European Search Report for European Application No. 22211705.3 dated May 4, 2023.

*Primary Examiner* — Neel D Shah
(74) *Attorney, Agent, or Firm* — Potomac Law Group, PLLC; John J. Penny, Jr.

(57) ABSTRACT

Probe head for wafer-level burn-in test, comprising: a first and a second alignment plates arranged parallel to each other and provided with a plurality of passage holes; at least one spacing element interposed between the first and the second alignment plates and designated for keeping them in a prefixed spaced apart relationship; a plurality of probes housed between the passage holes of the alignment plates; said probes comprising a stem, an input contact and an output contact at the opposite ends of said stem, wherein the input contact passes through the second alignment plate to electrically connect to a corresponding testing channel of a probe card and the output contact comes out of the first alignment plate and is designed to contact a termination of a wafer to be tested; said output contact being retractable into the stem in opposition to a counteracting elastic element.

13 Claims, 8 Drawing Sheets

(56)                     References Cited

U.S. PATENT DOCUMENTS

| | | | |
|---|---|---|---|
| 2015/0054537 A1* | 2/2015 | Taber, Jr. ........... | G01R 1/07314 |
| | | | 324/750.25 |
| 2019/0302148 A1* | 10/2019 | Maggioni .......... | G01R 1/07378 |
| 2020/0386787 A1* | 12/2020 | Contractor ......... | G01R 31/2601 |

* cited by examiner

PROBE HEAD FOR WAFER-LEVEL BURN-IN TEST (WLBI) AND PROBE CARD COMPRISING SAID PROBE HEAD

PRIORITY CLAIM

The present application claims priority under 35 U.S.C. § 119(a) to European Application No. 22211705.3 field on Dec. 6, 2022, the entire contents of which are incorporated by reference.

FIELD OF APPLICATION

The present disclosure relates to a so-called probe head having an improved structure for a probe card for performing tests on integrated electronic circuits, and to a corresponding probe card comprising said probe head.

More in particular, the disclosure relates to a probe head of the type intended for wafer-level burn-in test. These probe heads, and the corresponding probe cards, allows to simultaneously contact all the terminations or pads of a wafer. Said equipment is used in the production phase of integrated electronic circuits to identify and discard any defective circuits directly at a wafer level.

BACKGROUND

In the field of the disclosure, the use of probe heads of the above-mentioned type, usually comprising a pair of guide plates arranged parallel to each other in a prefixed spaced apart relationship and provided with a plurality of guide and housing holes for needle probes representing contact elements for the terminations of integrated circuits, is known.

These contact probes of the probe head are made up of wires of special alloys that have peculiar electrical and mechanical properties, and that pass through the holes of the plates emerging from one of the two plates with an end or contact head.

The probes are mounted and held between the two plates in a position that is substantially perpendicular to the plates themselves so that, in the jargon of this specific technical field, they are defined "vertical probes". This specific substantially vertical configuration allows incorporating a relatively high number of probes per unit area, so as to be able to perform tests even on integral circuits characterized by extremely low pitches, in the order of 30-40 μm for the latest generation integrated circuits.

Although the above-outlined device substantially fulfills the needs of the field, it nonetheless has some drawbacks, regarding the production cost and especially the relative brittleness of the probes that may break and would be difficult to replace.

SUMMARY

The technical problem underlying the present disclosure is to devise a probe head for wafer-level burn-in test that solves, or at least mitigates, the above-reported drawbacks, and that in particular ensures an improved stoutness of the probes with a relatively low production cost.

The solution idea underlying the present disclosure is to use, instead of the traditional needle probes, contact clips as pogo pins, thereby considerably improving the stoutness of said element, and to propose, in addition, an assembling structure dedicated to said contact clips so as to facilitate assembly of the probe head.

Based on the above solution idea, the technical problem is solved by a probe head for wafer-level burn-in test, comprising:

a first and a second alignment plates arranged parallel to each other and provided with a plurality of passage holes;

at least one spacing element interposed between the first and the second alignment plates and designated for keeping them in a prefixed spaced apart relationship;

a plurality of probes housed between the passage holes of the alignment plates;

said probes comprising a stem, an input contact and an output contact at the opposite ends of said stem, wherein the input contact passes through the second alignment plate to electrically connect to a corresponding testing channel of a probe card and the output contact comes out of the first alignment plate and is designed to contact a termination of a wafer to be tested;

said output contact being retractable into the stem in opposition to a counteracting elastic element.

The probes of the suggested type are comparable to contacts of the pogo-pin type and ensure the necessary cushioning to the repeated electrical contacts the probe head is required to do.

In a preferred embodiment, the probe employs a helical spring housed in the stem, whose elastic action pushes the electrical contact in extracted position. Of course, it is not excluded that the retractable output contact may be made in an alternative manner.

Preferably, the stem of the probe is rectilinear, and the two input and output contacts are aligned therewith. The probe may therefore be arranged in a perfectly perpendicular manner with respect to the alignment plates, that is the holes of the first and of the second alignment plates are aligned with each other.

In other words, it is not necessary to provide an inclination of the probe during test execution, which is, instead, the case for the needle probes of the prior art that have to be able to bend to ensure the required cushioning.

Preferably, also the input contact, as well as the output contact, is retractable into the stem in opposition to a counteracting elastic element. This allows a stable electrical connection even in the absence of welds or other systems of reciprocal welding of contacts.

Preferably, the probe head further comprises a spacer that is made of dielectric material, surrounded by said spacing element and also interposed between the first and the second alignment plates, said spacer being provided with a plurality of through holes for housing said probes.

The use of the spacer made of dielectric material is especially advantageous for two different reasons.

On one hand, it allows an extreme simplification of assembling operations since it stably keeps in position the probes during the operations of assembly of the two alignment plates on the spacing element. In other words, the spacer made of dielectric material acts as a pre-alignment matrix for the various probes, whereas the application of the two opposite alignment plates allows to precisely position the contacts, according to the micrometrical tolerances required for test application.

On the other hand, the presence of a dielectric separating the probes from each other ensures a better electrical insulation between the various contacts, thereby ensuring the efficiency and safety of the head even in test applications at high voltage.

The dielectric material used may be PEEK or another plastic material with mechanical and insulation properties suitable for the application.

Preferably, the spacing element is made of metal material, more preferably of steel. Therefore, the spacing element defines a rigid metal frame capable of bearing the high pressures applied to ensure the electrical contact during test operations.

Preferably, said spacing element comprises at least one perimetral frame along the perimeter of the probe head.

In a preferred embodiment, the perimetral frame has annular shape but it may, of course, have a different shape.

Moreover, said spacing element may comprise one or more cross members that divide the area of the perimetral frame in two or more sectors, said spacer being divided in just as many separate distinct portions, each of which occupies a different sector.

The above-mentioned subdivision in distinct portions of the spacer further facilitates the assembly of the probe head, since it is possible to align the probes for successive groups. Also, the replacement of a possible worn or defective probe is simplified, since the replacement operations may be directed to only one sector of the probe head.

In a preferred embodiment, one of the cross members extends diametrically with respect to the annular frame and the others extend according to chords that are parallel to the diametrical cross member.

In a preferred embodiment, the cross members are three and define four sectors.

Preferably, also the first alignment plate is divided in distinct juxtaposed portions, each of said portions covering a different sector.

Preferably, also the second alignment plate is divided in distinct juxtaposed portions, each of said portions covering a different sector.

As a person skilled in the art would easily understand, also the subdivision of the alignment plates has the purpose of simplifying both assembly and maintenance operations.

Preferably, the portions of the first and/or of the second alignment plate have countershaped profiles of reciprocal contact. In other words, the different portions adhere to each other following a non rectilinear profile, thereby ensuring an alternation of shapes that allow both portions to be fastened by means of fixing screws to the underlying cross member of the spacing element.

Preferably, the profiles of reciprocal contact have alternating teeth, on said teeth being alternately provided, on one and on the other one juxtaposed portions, bores for fixing screws aligned along an underlying cross member.

The probe head may comprise fixing screws that pass through said first and second alignment plates and said interposed spacing element, the fixing screws being arranged at least along said perimetral frame, but preferably also along the cross members.

Thanks to what is described above, the structure of the probe head is assembled as a sandwich; wherein the use of a spacer is provided, said spacer is housed in the structure defined by the outer metal frame and by the opposite alignment plates.

Preferably, said spacer comprises a perimeter flange inserted under an undercut of the spacing element, so as to facilitate assembling and to ensure a correct reciprocal positioning of the components.

Preferably, said first and second alignment plates are made of ceramic material, for example of alumina. The alignment plates made of ceramic may be machined by means of a machine tool with extreme precision to ensure the required tolerances in the alignment of contacts.

The above-identified technical problem is also solved by a probe card comprising printed circuits for performing wafer-level burn-in tests and a probe head of the above-mentioned type, electrically connected to said printed circuits.

The features and advantages of the probe head and of the corresponding method of assembly will become clearer from the description of an embodiment given by way of non-limiting example with reference to the appended drawings.

DETAILED DESCRIPTION

Figure 1:
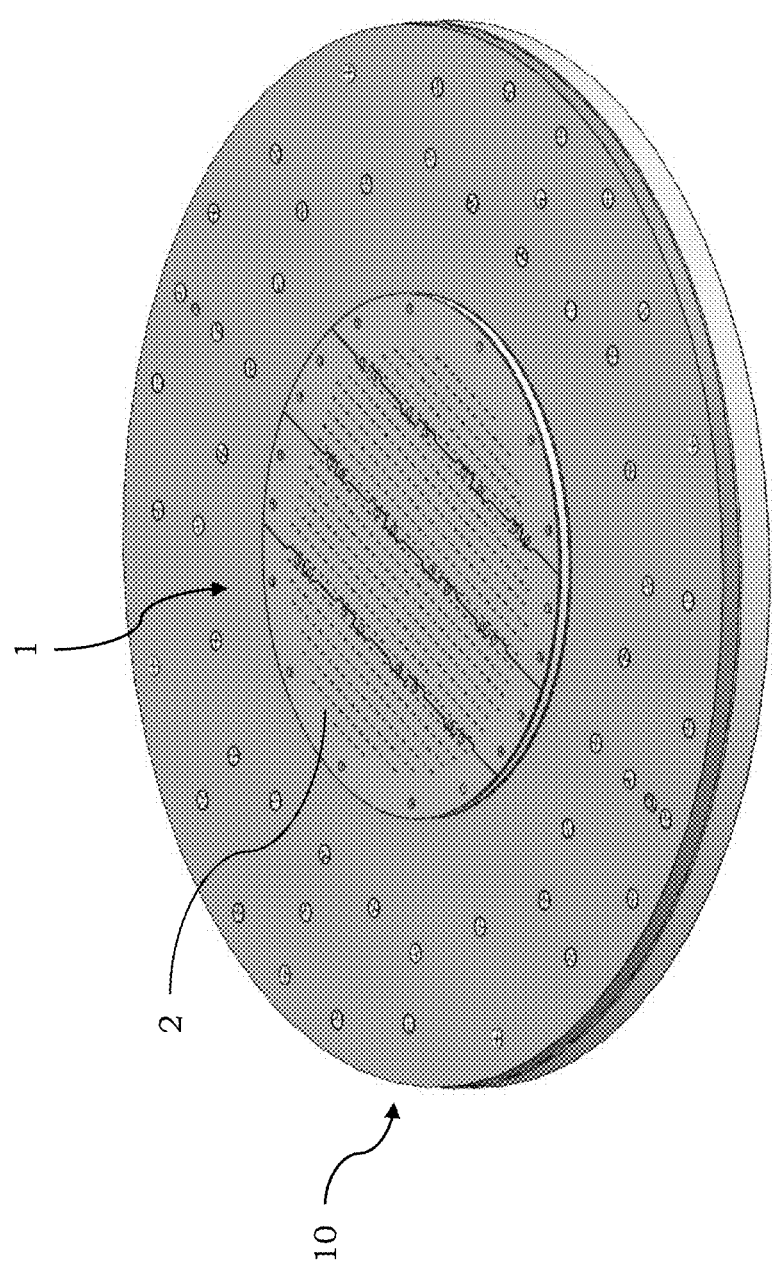
FIG. 1 shows a perspective view of a probe card according to the present disclosure.
Figure 2:
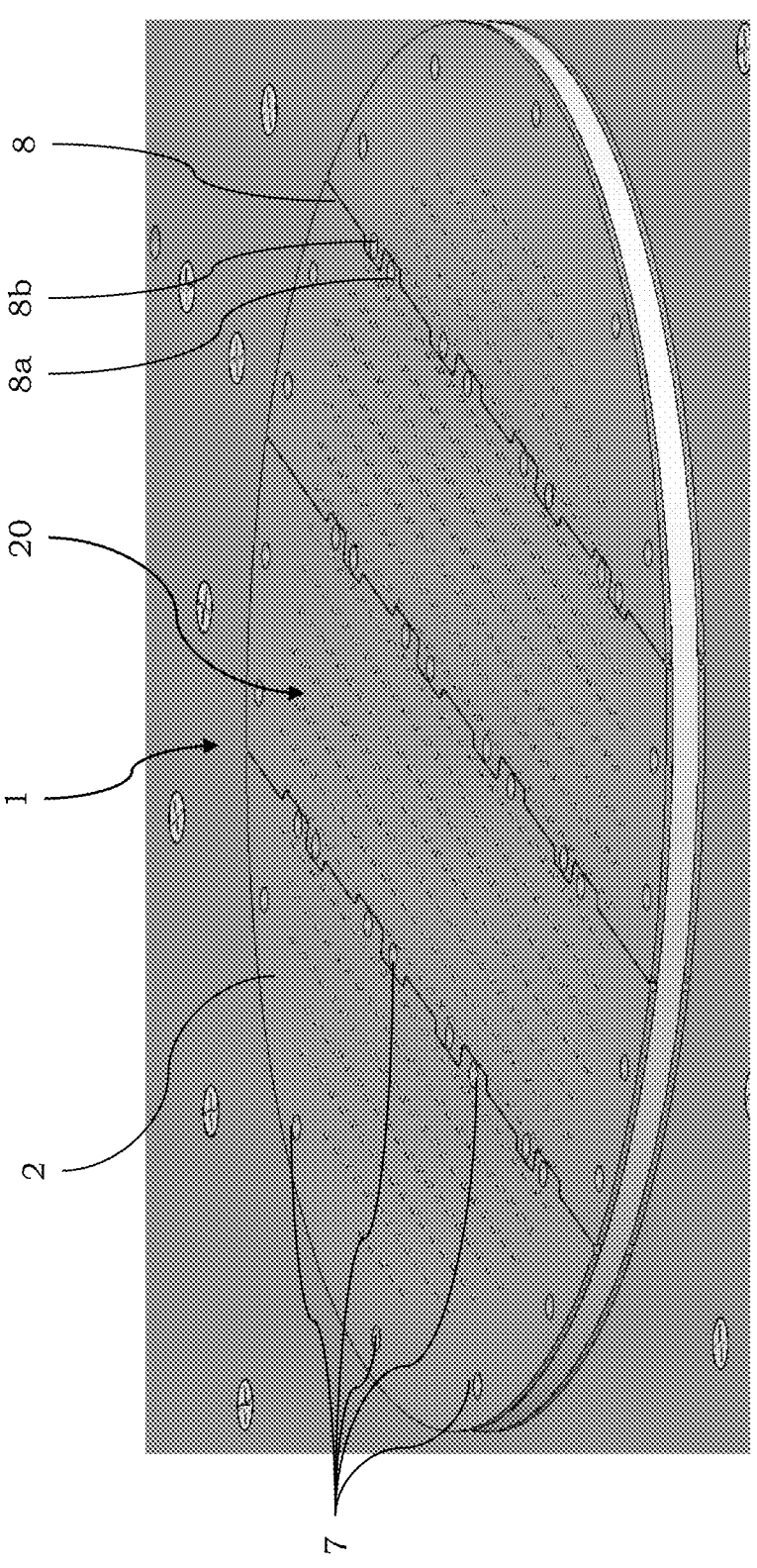
FIG. 2 shows an enlargement of the probe head of the probe card of FIG. 1.
Figure 3:
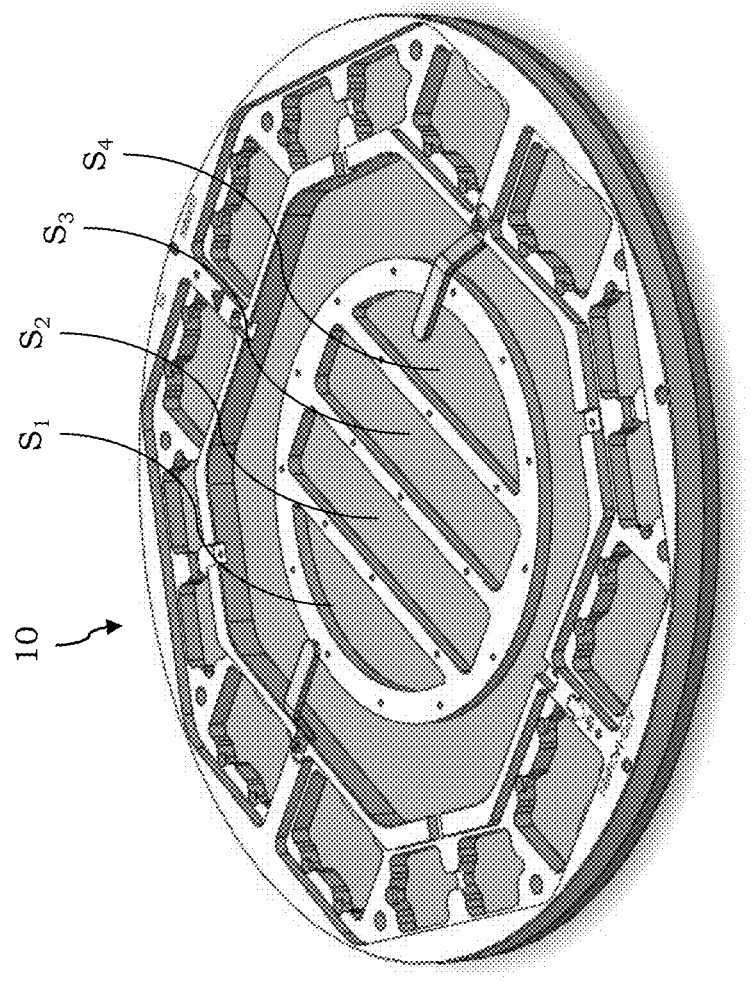
FIG. 3 shows a perspective view of the probe card of FIG. 1 in a different configuration, turned upside down with respect to the previous one.
Figure 4:
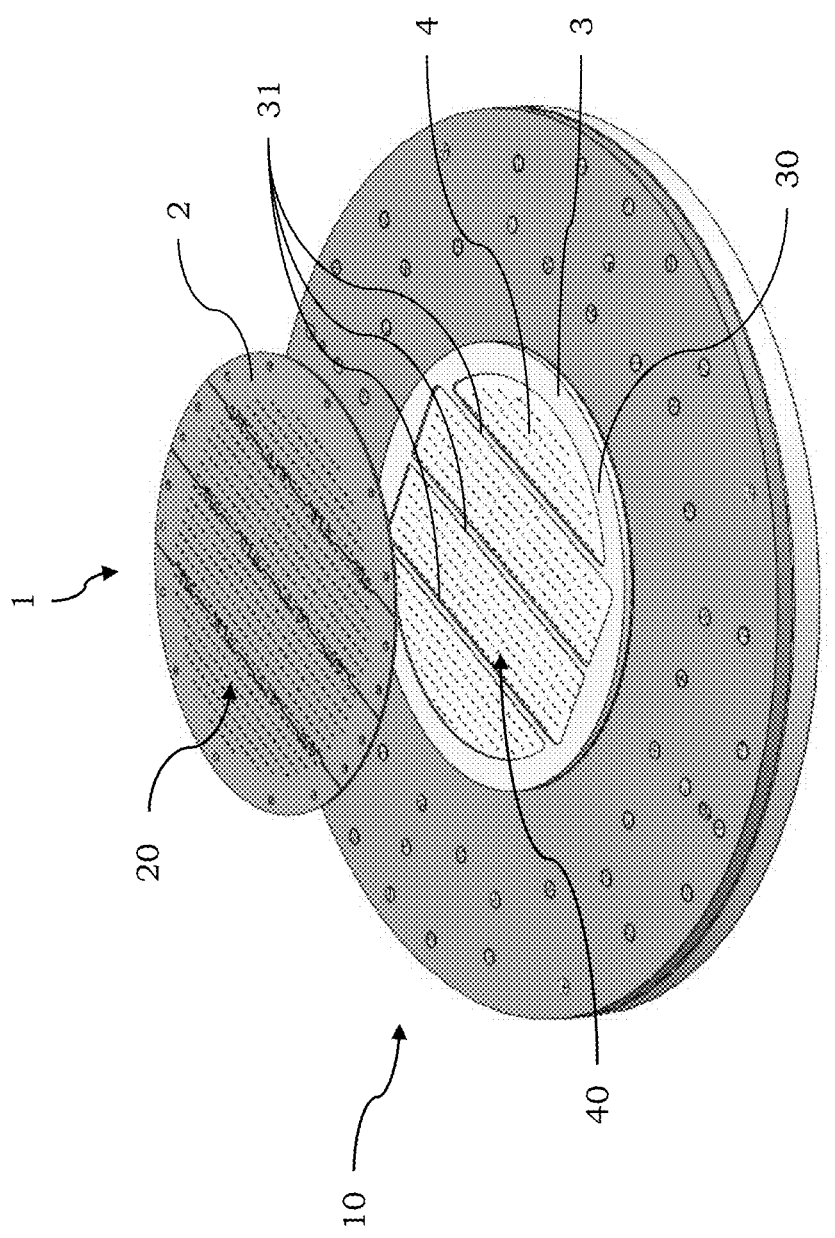
FIG. 4 shows the probe card of FIG. 1 with the outermost alignment plate lifted to make the inner structure visible.
Figure 5:
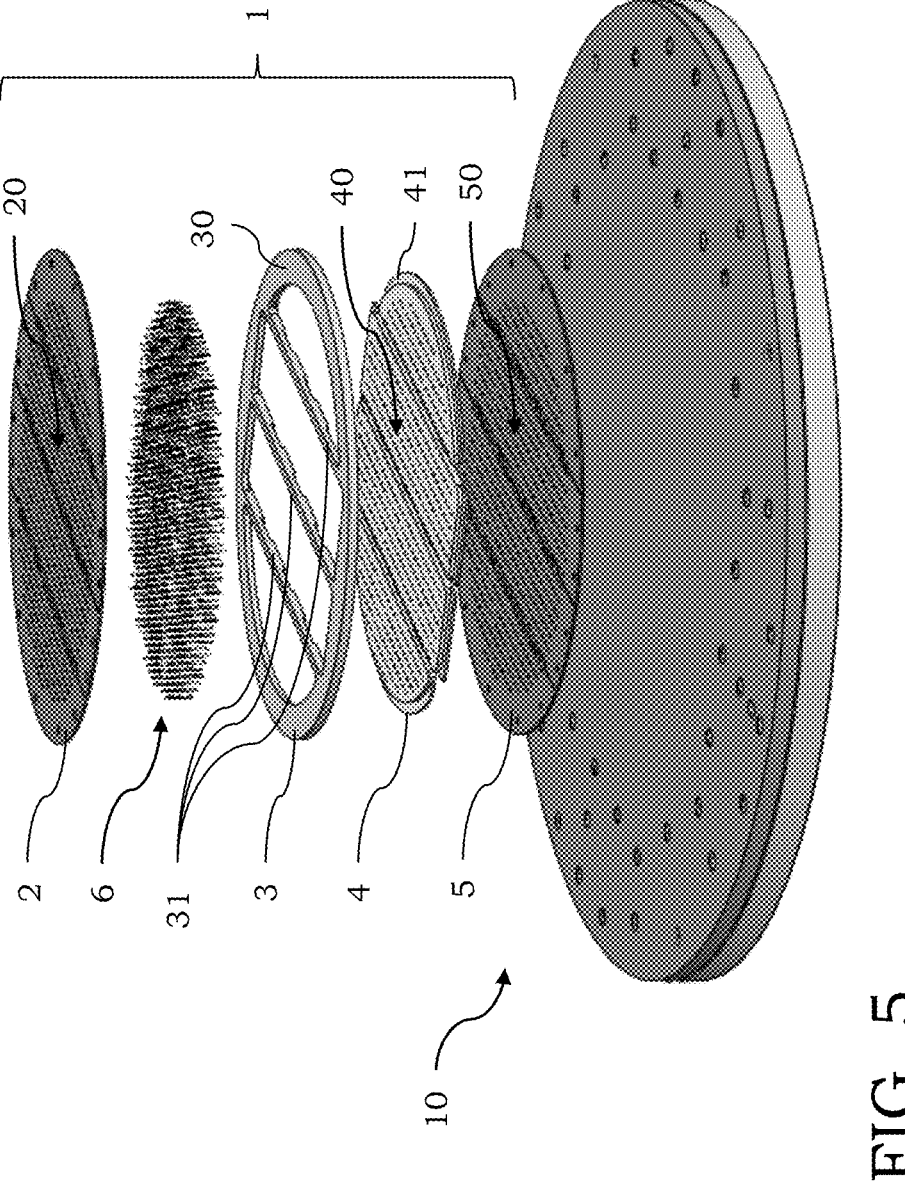
FIG. 5 shows a perspective exploded view of the probe head provided on the probe card of FIG. 1.

With reference to the figures of the appended drawings, reference number 10 globally and schematically identifies a probe card according to the present disclosure, of the type intended for the wafer-level burn-in test. The probe head, identified with reference number 1 in the drawings, is the characterizing element of said probe card.

It should be noted that the figures show schematic views and are not drawn on scale, but so as to emphasize the most important aspects and features of the present disclosure. The shapes of the elements and of the component parts of the probe card 10 and the probe head 1 are also not binding.

The probe card 10 and the probe head 1 are illustrated in the figures in an embodiment configuration. The relative and absolute positions and orientations of the various parts forming the element, which are defined by means of terms such as "upper" and "lower", "above" and "below", "horizontal" and "vertical" or other equivalent terms, must always be interpreted with reference to this configuration.

As identified in the paragraph dedicated to the field of application, the probe head 1 is intended to put a plurality of terminations or pads of the device to be tested, in particular a wafer 100, in contact with corresponding channels of the probe card to automatically perform some tests so as to identify and discard any defective chips.

If the probe card 10 is structured in a per se known manner as a discoidal element provided with the printed circuits—not shown in the appended figures—that are necessary for performing the tests on the wafers, the novel probe head 1 mounted in the center thereof deserves an accurate description.

The round-shaped probe head 1 comprises a plurality of overlapping-mounted layers.

At the two ends, a first 2 and a second 5 alignment plates, which are substantially identical and parallel to each other, enclose the probe head.

Figure 7:
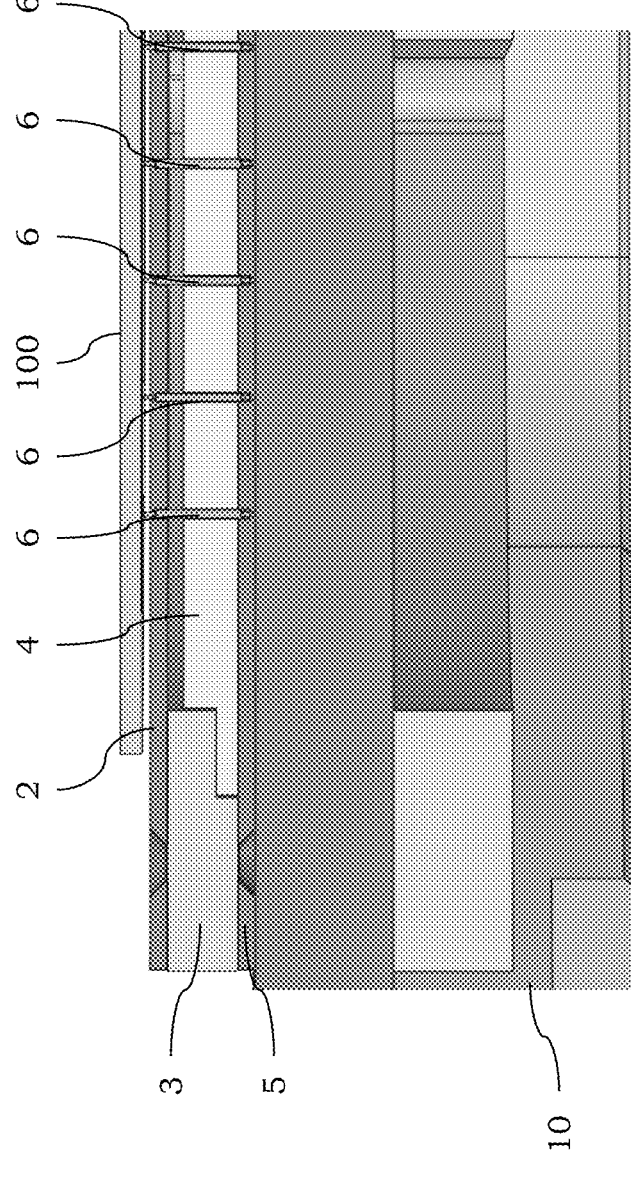
FIG. 7 shows the section of FIG. 6 in operating configuration, with coupling to a wafer to be tested.
Figure 9:
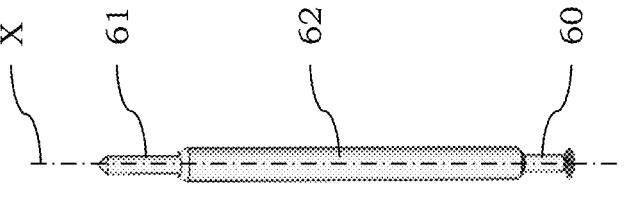
FIG. 9 shows the detail of a probe of the type used in the probe head according to the present disclosure.
Figure 8:
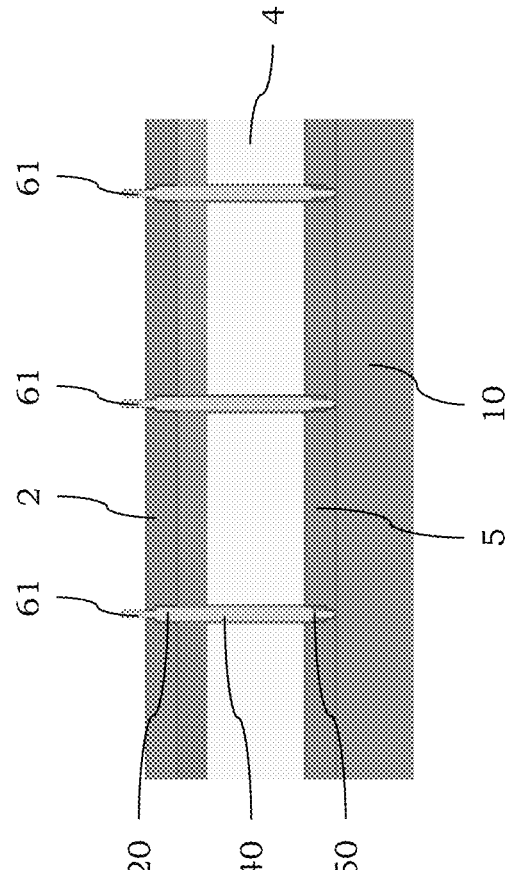
FIG. 8 shows an enlarged detail of the section of FIG. 6.

As can be deduced from the figures, and especially from FIG. 7, the first alignment plate 2 is the outermost one, and, in use, is arranged next the wafer 100 to be tested; instead, the second alignment plate 5 is coupled above the probe card.

The two alignment plates 2, 5 are both made of ceramic material, in particular alumina or another material with similar properties, and have a plurality of holes 20, 50 in the middle, the holes being separated by a minimum center-to-center distance (pitch) approximately between 30 μm and 100 μm.

Thus, the alignment plates 2, 5 with the relative holes 20, 50 are made with extreme precision, by machining by means of a machine tool.

A metal frame, in particular made of steel, is provided between the two alignment plates 2, 5, said frame being below identified as spacing element 3. The spacing element 3 has an outer annular frame 30, as well as a plurality of cross members 31 that divide the surface of the probe head 1 in a plurality of sectors $S_{1-4}$.

In particular, a first cross member 31 extends diametrically with respect to the annular frame 30, whereas the other two are parallel to it so as to define four distinct sectors $S_{1-4}$. Two lateral sectors $S_1$, $S_4$, identical to each other, extend according to arcs of a circle; two central sectors $S_2$, $S_3$, also identical, have instead a substantially rectangular shape. In any case, said subdivision is only a non-limiting example.

Between the two alignment plates 2, 5, and inside the voids defined by the annular frame 30 and by the cross members 31, a spacer 4 made of dielectric material, in particular PEEK, is inserted.

In this instance, since the annular frame 30 and the cross members 31 define four distinct sectors $S_{1-4}$, the spacer 4 has four portions $4_{1-4}$ that are separated from each other and have the same conformation.

Figure 6:
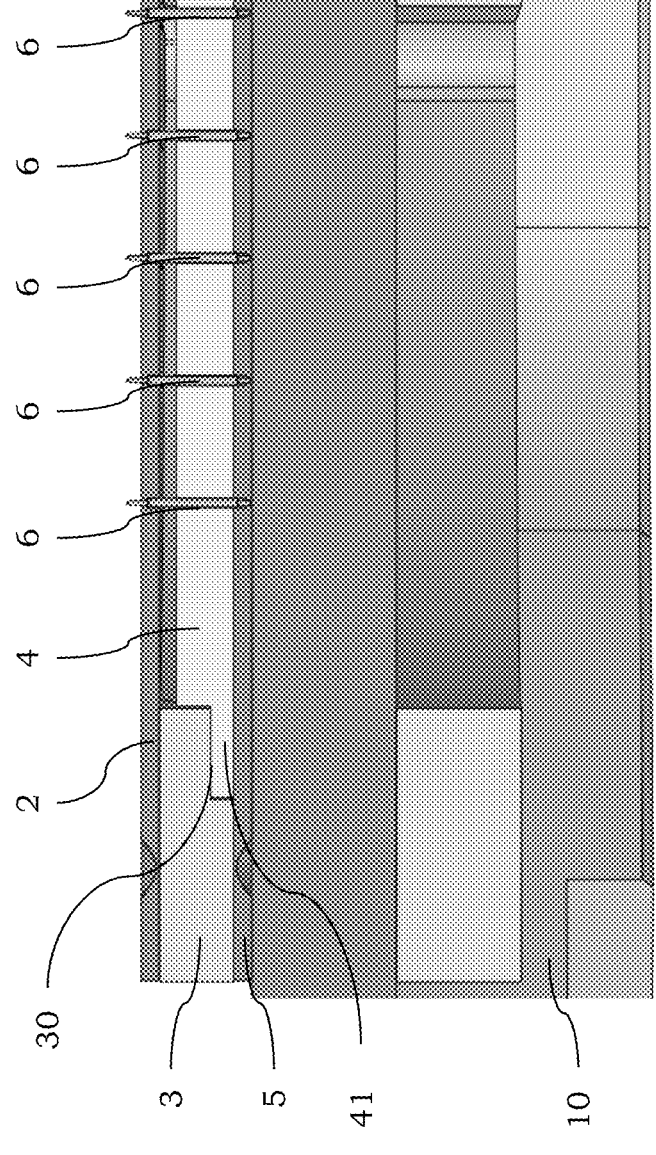
FIG. 6 shows a section of a detail of the probe head of the probe card of FIG. 1.

As one can clearly observe in FIGS. 6 and 7, the spacer 4 has a lateral flange 41 that is inserted under an undercut 32 of the annular frame 30.

It is observed that the spacer has holes 40 aligned with the corresponding holes 20, 50 of the alignment plates 2, 5.

The two alignment plates 2, 5 are also divided in four portions $2_{1-4}$, $5_{1-4}$ that overlap the corresponding sectors $S_{1-4}$ defined by the spacing element 3.

It is observed that the alignment plates 2, 5 have a plurality of openings, both along their outer circumference and at the joints between juxtaposed portions, that house just as many fixing screws 7. Therefore, said screws 7 pass through the spacing element 3, which also has suitable bores along the annular frame 30 and the cross members 31, thereby packing together the various elements that constitute the probe head 1.

It is observed that the juxtaposed portions of the alignment plates 2, 5 have an indented profile of reciprocal contact 8, provided with alternating teeth 8a, 8b. Openings for the fixing screws 7 are made on said alternating teeth 8a, 8b, so that the screws appear aligned along a same cross member 31 even though they respectively pertain the one and the other juxtaposed portions.

The main element of the disclosure are the probes 6, which pass through the probe head 1 by fitting in the holes 20, 40, 50 made on the alignment plates 2, 5 and through the spacer 4.

The probes 6 are made in a way similar to pogo-pin, i.e., they comprise a rectilinear stem 62 from which an input contact 60 and an output contact 61 emerge at opposite ends, both contacts being retractable against the action of an inner counteracting spring. Both the stem 62 and the two contacts 60, 61 extend along a direction X that is transversal with respect to the probe head 1, i.e., perpendicular to the alignment plates 2, 5.

As can be inferred from the Figures, the holes 40 of the spacer 4 house the stem 62, the input contact 60 passes through the holes 50 of the second alignment plate 5 and the output contact 61 passes through the holes 20 of the first alignment plate 2. Now, the contacts 60, 61 necessarily have a diameter that is smaller compared to the stem 62, and the holes 20, 50 of the alignment plates 2, 5 also have a diameter that is smaller compared to those of the spacer in order to precisely position the contacts and to hold the probes 6 inside the probe head 1.

It can be appreciated that the above-defined structure, besides being stout and fully functional, allows to assemble the probe head 1 very easily.

In fact, in a first step the various probes may be positioned by means of the spacer 4 that acts as a pre-alignment matrix. The subsequent application of the alignment plates 2, 5 allows a more accurate definition of the relative position of the single contacts later. The tightening of the fixing screws 7 packs then the entire structure, keeping the desired positions for the probes 6.

The solution of the present disclosure thus solves the technical problem and achieves numerous advantages including: a very low cost and great structural and functional reliability.

In understanding the scope of the present disclosure, the term "comprising" and derivatives thereof, as herein used, are intended as open terms that specify the presence of the specified features, elements, components, groups, integers and/or steps, but do not exclude the presence of other non-specified features, elements, components, groups, integers and/or steps. The foregoing also applies to words with similar meanings such as the terms "including", "having" and derivatives thereof. Moreover, the terms "part", "section" and "portion", when used in the singular form, may have the double meaning of a single part or of a plurality of parts unless otherwise specified.

Although only selected embodiments were chosen to illustrate the present disclosure, it will be clear to the skilled person from this disclosure that several changes and modifications may be herein performed without departing from the scope of the invention as defined in the appended claims.

The invention claimed is:

1. A probe head for wafer-level burn-in test, comprising:
   a first and a second alignment plates arranged parallel to each other and provided with a plurality of passage holes;
   at least one spacing element interposed between the first and the second alignment plates and designated for keeping them in a prefixed spaced apart relationship;
   a plurality of probes housed between the passage holes of the alignment plates;
   said probes comprising a stem, an input contact and an output contact at the opposite ends of said stem, wherein the input contact passes through the second alignment plate to electrically connect to a corresponding testing channel of a probe card and the output contact comes out of the first alignment plate and is designed to contact a termination of a wafer to be tested; and
   a spacer made of dielectric material surrounded by said spacing element and also interposed between the first and the second alignment plates, said spacer being provided with a plurality of through holes for housing said probes;

said output contact being retractable into the stem in opposition to first counteracting elastic element; wherein said input contact is retractable into the stem in opposition to a second counteracting elastic element.

2. The probe head according to claim 1, wherein said spacing element is made of metal material.

3. The probe head according to claim 1, wherein said spacing element comprises at least one perimetral frame along the perimeter of the probe head.

4. The probe head according to claim 3, wherein said spacing element further comprises one or more cross members which divide the area of the perimetral frame in two or more sectors, said spacer being divided in just as many separate distinct portions, each of which occupies a different sector.

5. The probe head according to claim 4, wherein also the first alignment plate is divided in distinct juxtaposed portions, each of said portions covering a different sector.

6. The probe head according to claim 5, wherein the portions of the first and/or of the second alignment plate have countershaped profiles of reciprocal contact.

7. The probe head according to claim 6, wherein said profiles of reciprocal contact have alternating teeth, on said teeth being alternately provided, on one and on the other one juxtaposed portions, bores for fixing screws aligned along an underlying cross member.

8. The probe head according to claim 4, wherein also the second alignment plate is divided in distinct juxtaposed portions, each of said portions covering a different sector.

9. The probe head according to claim 4, wherein said fixing screws are further arranged along the cross members.

10. The probe head according to claim 3, comprising fixing screws that pass through said first and second alignment plates and said interposed spacing element, the fixing screws being arranged at least along said perimetral frame.

11. The probe head according to claim 1, wherein said spacer comprises a perimeter flange inserted under an undercut of the spacing element.

12. The probe head according to claim 1, wherein said first and second alignment plates are made of ceramic material.

13. A probe card comprising printed circuits for performing wafer-level burn-in tests and a probe head according to claim 1, electrically connected to said printed circuits.

* * * * *